United States Patent [19]
Gradinariu

[11] Patent Number: 5,828,614
[45] Date of Patent: Oct. 27, 1998

[54] MEMORY CELL SENSING METHOD AND CIRCUITRY FOR BIT LINE EQUALIZATION

[75] Inventor: Iulian Gradinariu, Colorado Springs, Colo.

[73] Assignee: Cypress Semiconductor Corp., San Jose, Calif.

[21] Appl. No.: 834,942

[22] Filed: Apr. 7, 1997

[51] Int. Cl.[6] ........................................... G11C 7/00
[52] U.S. Cl. ............................ 365/208; 365/207; 365/203
[58] Field of Search ..................................... 365/208, 207, 365/205, 203

[56] References Cited

U.S. PATENT DOCUMENTS

| | | | |
|---|---|---|---|
| 4,785,427 | 11/1988 | Young | 365/189 |
| 5,432,746 | 7/1995 | Guedj | 365/207 |
| 5,504,443 | 4/1996 | Gross et al. | 327/51 |
| 5,525,919 | 6/1996 | Phelan | 327/52 |

Primary Examiner—Vu A. Le
Attorney, Agent, or Firm—Blakely, Sokoloff Taylor & Zafman LLP

[57] ABSTRACT

A method and apparatus for sensing the state of a memory cell and equalizing bit line voltages without using ATD circuitry. One embodiment of the present invention is a memory device that includes a memory cell coupled to a pair of bit lines, a bit line load circuit coupled to the bit lines, an equalization circuit coupled to the bit lines, and a sense amplifier circuit having inputs coupled to the bit lines and an output coupled to the equalization circuit. The memory cell may be an SRAM cell with a pair of cross-coupled inverters. The equalization circuit may be an SRAM cell with a pair of inverters that are not cross coupled. The inputs of the inverters in the equalization circuit may receive signals output by the sense amplifier circuit, and the outputs of the inverters may be coupled to the pair of bit lines. The sense amplifier senses data output by the memory cell to the bit lines, and generates output signals. The equalization circuit receives the output signals and drives the bit lines with opposite data relative to the data output by the memory cell so as to equalize the bit lines.

14 Claims, 12 Drawing Sheets

MEMORY CELL SENSING METHOD AND CIRCUITRY FOR BIT LINE EQUALIZATION

BACKGROUND OF THE INVENTION

1. Field of the Invention

The present invention generally relates to the field of semiconductor memory devices. More particularly, the present invention relates to a method and apparatus for equalizing bit line voltages without using address transition detection (ATD) circuitry.

2. Background

In order to reduce delays in accessing a memory cell, such as a static random access memory (SRAM) cell, many memory devices include address transition detection (ATD) circuitry that detects address transitions supplied to the memory device and generates an equalization pulse to restore differential nodes to a particular state prior to being selected.

One example of a conventional memory device 10 including an ATD circuit is shown in FIG. 1. ATD 18 monitors word lines WL0 and WL1 and read control signals. When memory device 10 pulls WL0 low to deselect memory cell 12 and pulls WL1 high to select memory cell 14, ATD 18 detects the word line transitions and sends an equalization pulse to transistor 16 such that bit lines BL and BLB are equalized or shorted together. Equalizing the bit lines enables the data stored in memory cell 14 to generally be sensed faster than if no equalizing occurred.

While generally decreasing the access time or sense path for reading data stored in memory cells, ATD circuitry has several disadvantages. First, as better and faster performance is expected with each new generation of memory products, the complexity of the ATD circuitry increases requiring more design time and die area. Second, if the ATD circuitry fails by not generating an equalization pulse or by generating an equalization pulse at the wrong time, then the entire memory device may fail. Some memory designs include additional circuitry to recover from ATD failures, however, these designs push out the access time of memory cells by as much as 20 to 40%. Third, an equalization pulse is not generated until the ATD circuit detects an address transition. The speed of the sense path could be increased if equalization occurred sooner. Fourth, the sense path of a memory cell can be delayed due to a "dead time" caused by signal margin guardband required between deselection of WL0 and selection of WL1 at the end of an equalization pulse. Ideally, WL0 is deselected and WL1 is selected at the end of the equalization pulse applied to transistor 16. However, practical considerations (e.g., signal delays etc.) cause a certain amount of guardband to be included between the deselection of WL0, the selection of WL1, and the end of the equalization pulse. This guardband delay generally adds 1–2 nanoseconds (ns) to the sense path.

Therefore, it is desirable to remove the ATD circuitry from the sense path of a memory device to reduce design complexity, reduce the size of the memory device, obviate the delays involved with designing for possible ATD failures, equalize the bit lines without having to first detect a change in an address or word line, and to obviate the need to design for the dead time due to signal margin guardband between word line selection and the end of an equalization pulse generated by an ATD.

There have been previous attempts to remove ATD circuitry in higher speed memory devices including pulsing WL0 and WL1 and coupling latching sense amplifiers to bit lines BL and BLB. However, if the sense amplifier circuit coupled to the bit lines fails (e.g., due to noisy operating conditions) and outputs incorrect data, then these schemes do not allow for recovery from the failure.

Therefore, what is also needed is a method and circuitry that equalizes bit lines and allows for the recovery of an correct state output by a sense amplifier.

SUMMARY OF THE INVENTION

The present invention concerns a method and apparatus for sensing the state of a memory cell and equalizing bit line voltages without using ATD circuitry. One embodiment of the present invention is a memory device that includes a memory cell coupled to a pair of bit lines, a bit line load circuit coupled to the bit lines, an equalization circuit coupled to the bit lines, and a sense amplifier circuit having inputs coupled to the bit lines and an output coupled to the equalization circuit. The memory cell may be an SRAM cell with a pair of cross-coupled inverters. The equalization circuit may be an SRAM cell with a pair of inverters that are not cross coupled. The inputs of the inverters in the equalization circuit may receive signals output by the sense amplifier circuit, and the outputs of the inverters may be coupled to the pair of bit lines. The sense amplifier senses data output by the memory cell to the bit lines, and generates output signals. The equalization circuit receives the output signals and drives the bit lines with opposite data relative to the data output by the memory cell so as to equalize the bit lines.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, in which.

DETAILED DESCRIPTION

A method and apparatus for sensing the state of a memory cell and equalizing bit line voltages without using ATD circuitry is disclosed. In the following description, for purposes of explanation, specific details are set forth such as specific materials, thicknesses, parameters, etc., in order to provide a thorough understanding of the present invention. However, it will be apparent to one skilled in the art that these specific details may not be required to practice the present invention. In other instances, well-known process steps, equipment, etc., have not been described in particular detail so as not to obscure the present invention.

The present invention equalizes bit line voltages without using external ATD circuitry. As will be described in more detail below, an equalization cell is provided in each column of memory cells in a memory array. When data is output from a memory cell to a pair of bit lines, the data is sensed by a sense amplifier that is coupled to the equalization cell. The equalization cell receives the output of the sense amplifier and drives the bit lines with opposite data relative to the data output by the memory cell so as to equalize the voltages on the bit lines. The equalization cell may drive the bit lines after the sense amplifier has reached a decision and may drive the bit lines at the same time that the selected memory cell is driving the bit lines. There is no need for the memory device to wait for a subsequent address or word line transition for the bit lines to be equalized.

Figure 1:
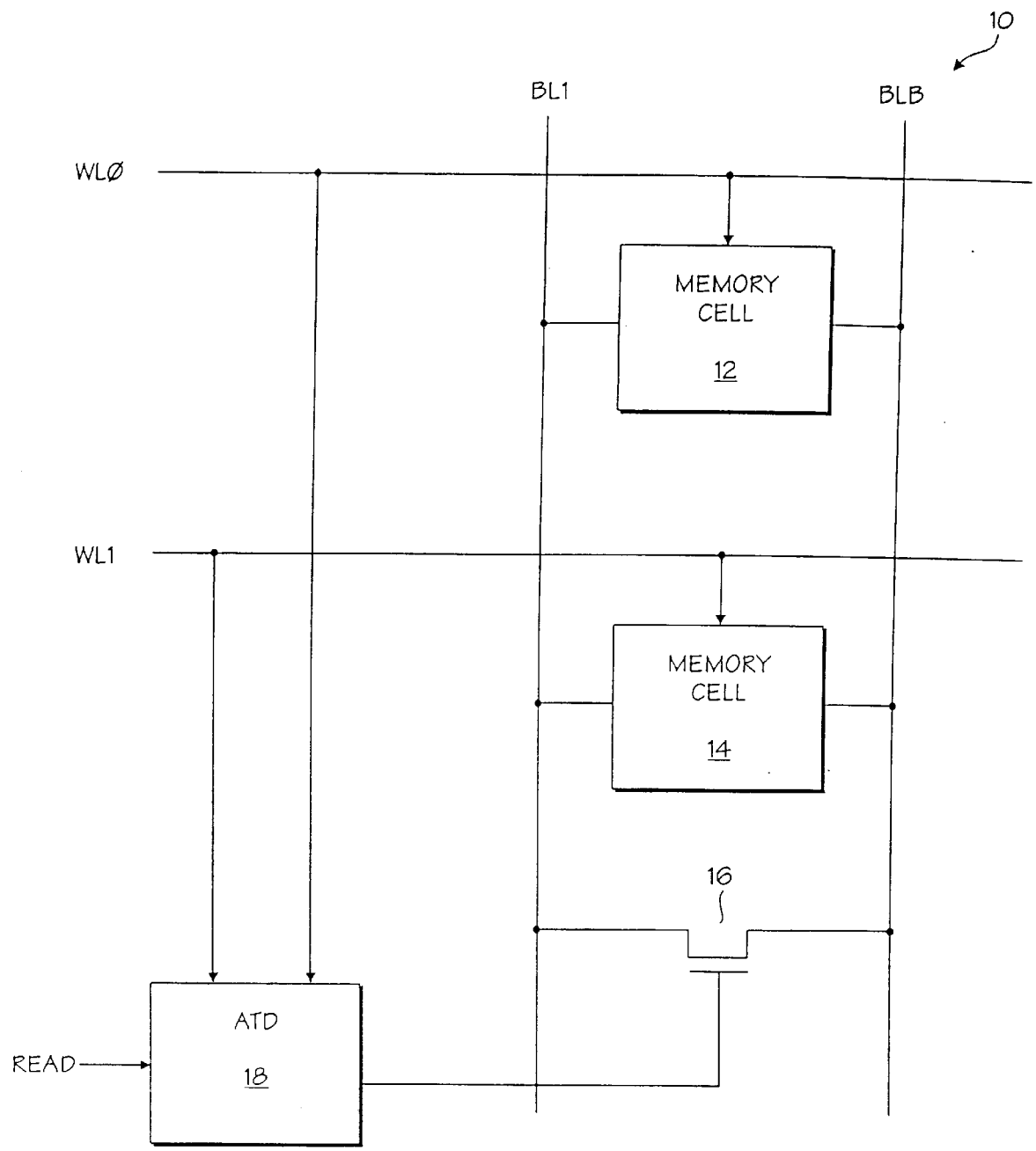
FIG. 1 is a block diagram of a conventional memory device including an ATD circuit.
Figure 2:
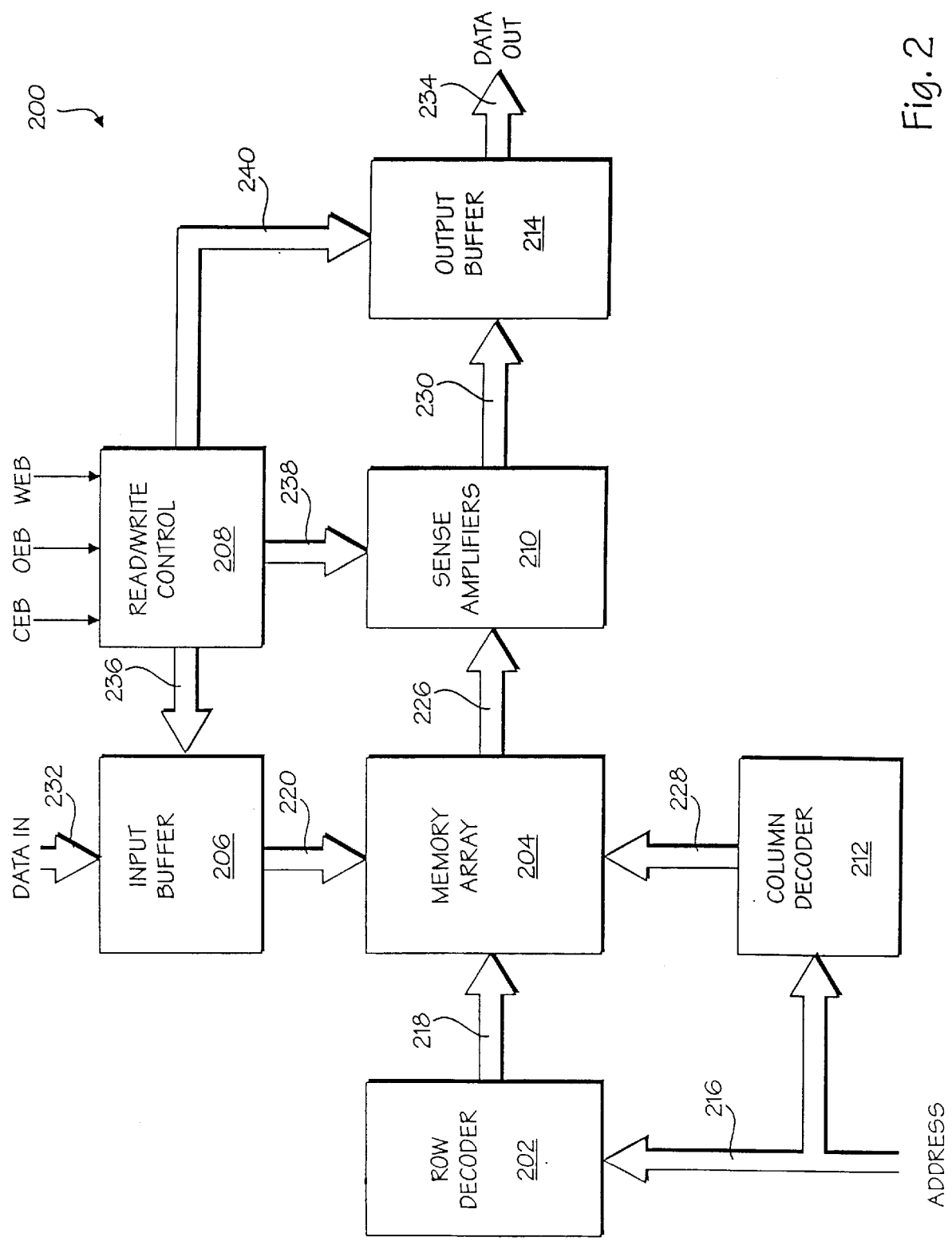
FIG. 2 is a block diagram of one embodiment of a memory device in which the present invention may be included.

FIG. 2 shows memory device 200 in which the present invention may be included. Memory device 200 is one embodiment of an SRAM device. Other SRAM device configurations may also incorporate the present invention.

Memory device 200 includes memory array 204 that may include SRAM cells. Memory cells are accessed by providing an address on bus 216. The address is decoded by row decoder 202 and column decoder 212. Row decoder 202 couples a decoded row address on word lines 218 to memory array 204, and column decoder 212 couples a decoded column address on bus 228 to memory array 204.

Data may be written into memory array 204 from data input bus 232 via input buffer 206 and bus 220. Data may be read out from memory array 204 to data output bus 234 via bus 226, sense amplifiers 210, bus 230, and output buffer 214. Reading and writing of data may be controlled by read/write control 208 that receives control signals chip enable CEB, output enable OEB, and write enable WEB, and that controls input buffer 206 via bus 236, sense amplifiers 210 via bus 238, and output buffer 214 via bus 250. Other control signals may also be provided.

Figure 3:
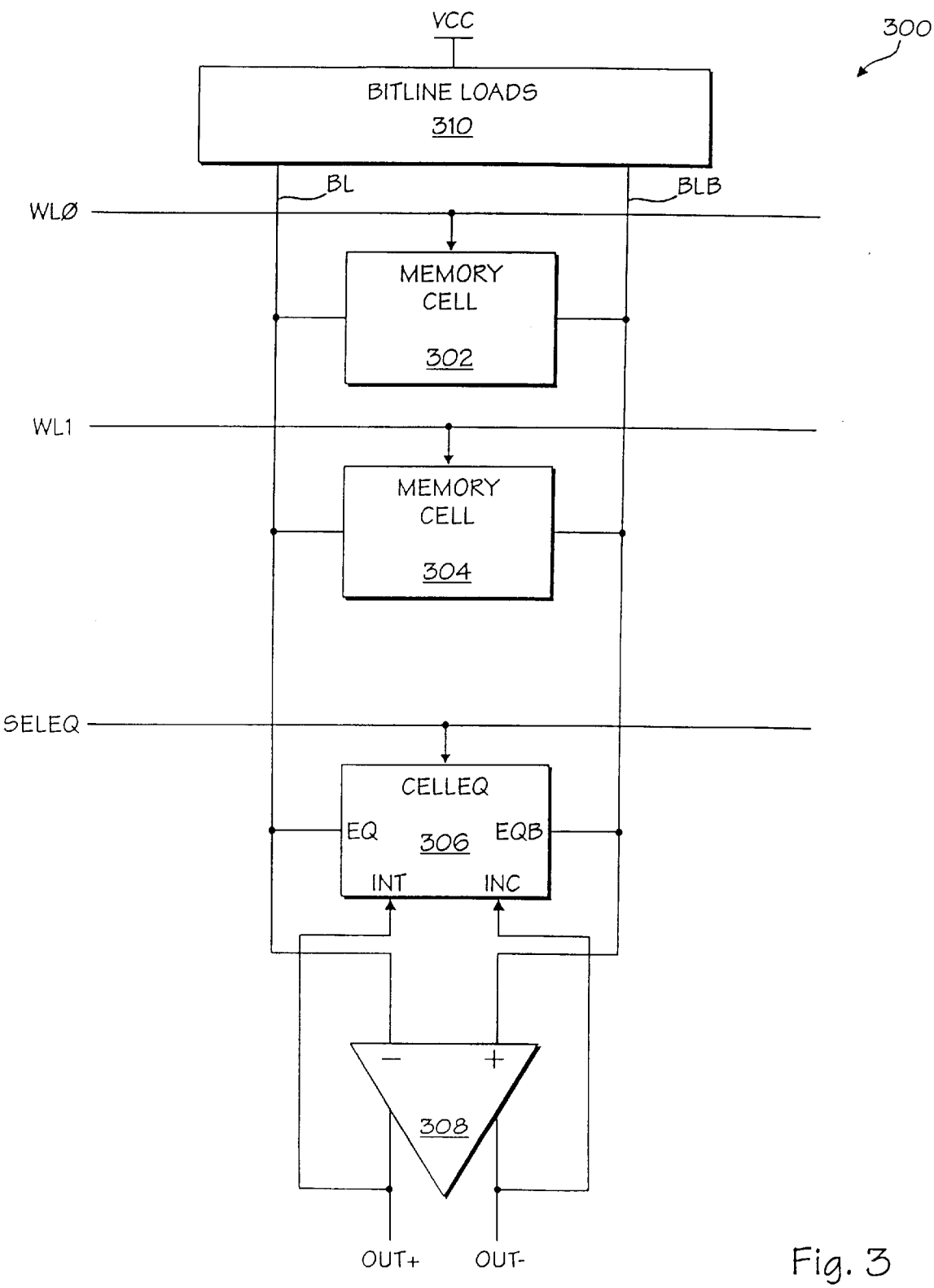
FIG. 3 is block diagram of one embodiment of a memory column including memory cells, equalization cells, bit line loads, and a sense amplifier.

Memory array 204 includes rows and columns of SRAM cells or blocks of rows and columns of SRAM cells. FIG. 3 shows an exemplary column of memory cells 300 including memory cells 302 and 304 coupled to word lines WL0 and WL1, respectively, and bit lines BL and BLB. Bit lines BL and BLB are pulled towards power supply VCC by bit line load circuit 310. While FIG. 3 only shows two memory cells 302 and 304, column 300 may include any number of memory cells.

Data may be written into memory cell 302 by asserting WL0 to a high voltage or state and driving BL and BLB to predetermined opposite logic states. Data may be read from memory cell 302 by asserting WL0 to a high voltage or state and allowing memory cell 302 to output data or voltages to BL and BLB. The data output onto BL and BLB may then be sensed by sense amplifier 308. Reading and writing to memory cell 304 is accomplished in like manner.

Sense amplifier circuit 308 has a non-inverting input coupled to BL and an inverting input coupled to BLB. There may be one sense amplifier 308 for each column 300 in memory array 204. Sense amplifier 308 may have a differential output that generates OUT+ and OUT− in response to the signals on BL and BLB. For example, if BLB has a higher voltage than BL, then sense amplifier 308 may amplify OUT+ to a logic one state and OUT− to a logic zero state. Conversely, if BL has a higher voltage than BLB, then sense amplifier 308 may amplify OUT− to a logic one state and OUT+ to a logic zero state. OUT+ and OUT− may be coupled to output buffer 214.

Column 300 also includes equalization cell CELLEQ 306 that has an input configured to receive a select signal SELEQ, an output EQ configured to output a voltage to BL, an output EQB configured to output a voltage to BLB, a true input INT configured to receive OUT+ from sense amplifier 308, and a complement input INC configured to receive OUT− from sense amplifier 308. Equalization cell 306 is enabled in response to SELEQ. SELEQ may be generated by an external signal, by row decoder 202, or by read/write control 208.

Equalization cell 306 is an equalization circuit that, in response to the output of sense amplifier 308, drives voltages on bit lines BL and BLB that oppose the voltages driven by memory cells 302 or 304. For example, if memory cell 302 is driving a high logic state on BL and low logic state on BLB, the equalization cell 306 may drive a low logic state on BL and a high logic state on BLB. Equalization cell 306 is coupled in a negative feedback arrangement with sense amplifier 308.

The selected memory cell, equalization cell 306, and bit line load circuitry 310 drive BL and BLB to equalization voltages that are approximately the same voltage level. Bit line load circuitry 310 may help to raise the equalization voltage on BL and BLB to a level than is sufficiently far away from the DC trip points of memory cells 302 and 304 as will be described in more detail below. For one embodiment, bit load circuitry 310 includes two p-channel diode-connected transistors that couple VCC to BL and VCC to BLB.

The bit line equalization scheme illustrated in FIG. 3 does not use ATD circuitry to equalize bit lines BL and BLB prior to reading; rather, after sensing data on BL and BLB, the negative feedback arrangement between sense amplifier 308 and equalization cell 306 cause equalization cell 306 to generate voltages on bit lines BL and BLB that result in equalization of the voltages on BL and BLB.

The scheme illustrated in FIG. 3 also does not need to detect an address transition or word line transition before equalizing BL and BLB; rather, reading a selected memory cell subsequently results in the equalization of the BL and BLB.

As each column in memory array 204 may include an equalization cell, each memory block within memory array 204 may include a row of equalization cells coupled to SELEQ.

For another embodiment, sense amplifier 308 includes a single terminal output. The voltage on the single terminal may indicate whether BL is greater or less than BLB. The single terminal may be coupled to either INT or INC of equalization cell 306. An inverter may be coupled between INT and INC to generate an inverted signal for the other input. For yet another embodiment, equalization cell 306 may have only INT or INC as an input and may have an internal inverter that generates the other input signal.

After the selected memory cell, equalization cell 306, and bit line load circuitry 310 has equalized the voltages on BL and BLB, there may be no differential voltage for sense amplifier 308 to detect. This may cause sense amplifier 308 to longer generate the appropriate voltages on OUT+ and OUT−. For one embodiment, sense amplifier 308 may have hysteresis such that even when the voltages on BL and BLB have been equalized, sense amplifier 308 continues to interpret the equalized voltages as differential information and may output the correct states for OUT+ and OUT−. Generally, the larger the amount of hysteresis at the inputs of sense amplifier 308 (i.e., on BL and BLB), the longer than its takes sense amplifier to flip OUT+ and OUT− to new states when new data is read from memory cells 302 or 304. For one embodiment, the amount of hysteresis between the voltages on BL and BLB may be approximately 400–800 millivolts which may correspond to approximately 1.5–2.5 volts of hysteresis in amplified signals OUT+ and OUT−.

Figure 4:
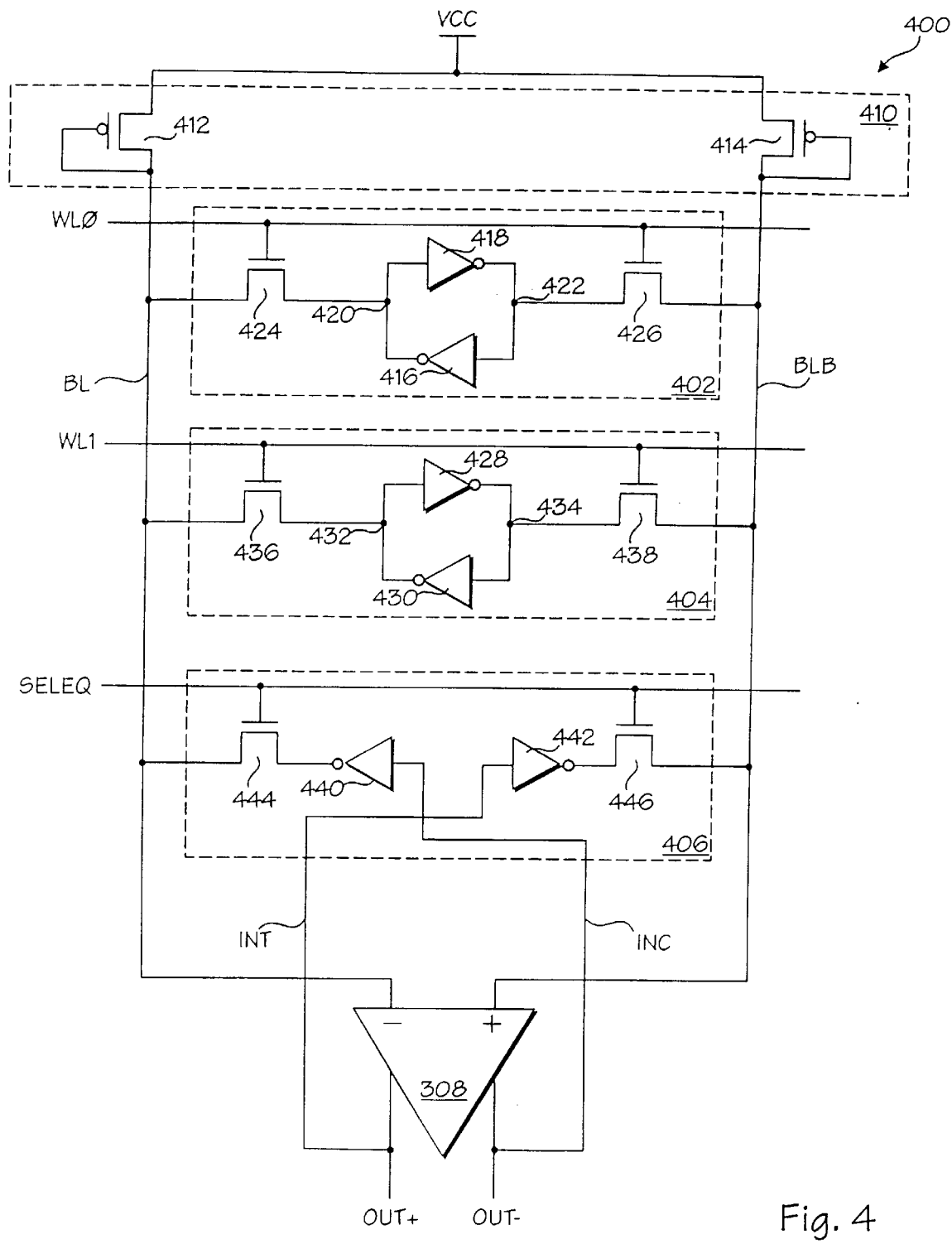
FIG. 4 is a circuit diagram of one embodiment of the memory cells, bit line loads, and equalization circuit of FIG. 3.

FIG. 4 shows column 400 that is one embodiment of column 300 of FIG. 3. Column 400 includes memory cells 402 and 404 coupled to word lines WL0 and WL1, respectively, and bit lines BL and BLB. Memory cell 402 is one embodiment of memory cell 302 of FIG. 3, and memory cell 404 is one embodiment of memory cell 304 of FIG. 3.

Memory cell 402 includes two access or pass transistors 424 and 426, and two cross-coupled inverter circuits 416 and 418. Access transistor 424 has its gate coupled to WL0, its drain (source) coupled to BL, and its source (drain) coupled to node 420. Access transistor 426 has its gate coupled to WL0, its drain (source) coupled to BLB, and its source (drain) coupled to node 422. The input of inverter 418 is coupled to node 420, and the output of inverter 418 is coupled to node 422. The input of inverter 416 is coupled to node 422, and the output of inverter 416 is coupled to node 420.

Memory cell 402 stores data at nodes 420 and 422. The data stored at node 420 is the opposite of data stored at node 422. Data may be written to nodes 420 and 422 by raising the voltage on WL0 to turn on access transistors 424 and 426 and then coupling the appropriate voltages on BL and BLB. The voltage on BL represents an opposite logic state with respect to the voltage on BLB. Data may be read from nodes 420 and 422 by raising the voltage on WL0 to turn on access transistors 424 and 426 such that the voltages on nodes 420 and 422 are coupled to BL and BLB, respectively. Sense amplifier 308 may then sense the voltages on BL and BLB.

Memory cell 404 includes two access or pass transistors 436 and 438, and two cross-coupled inverter circuits 428 and 430. Access transistor 436 has its gate coupled to WL0, its drain (source) coupled to BL, and its source (drain) coupled to node 432. Access transistor 438 has its gate coupled to WL0, its drain (source) coupled to BLB, and its source (drain) coupled to node 434. The input of inverter 428 is coupled to node 432, and the output of inverter 428 is coupled to node 434. The input of inverter 430 is coupled to node 434, and the output of inverter 430 is coupled to node 432.

Memory cell 404 stores data at nodes 432 and 434. The data stored at node 432 is the opposite of data stored at node 434. Data may be written to nodes 432 and 434 by raising the voltage on WL0 to turn on access transistors 436 and 438 and then coupling the appropriate voltages on BL and BLB. Data may be read from nodes 432 and 434 by raising the voltage on WL0 to turn on access transistors 436 and 438 such that the voltages on nodes 432 and 434 are coupled to BL and BLB, respectively. Sense amplifier 308 may then sense the voltages on BL and BLB.

Equalization cell 406 is one embodiment of equalization cell 306 of FIG. 3. Equalization cell 406 is very similar to memory cells 402 and 404, except that the cross-coupling interconnection between inverter circuits has been removed.

Equalization cell 406 includes two access or pass transistors 444 and 446, and two inverter circuits 440 and 442. Inverter 440 has its input coupled to input INC that is configured to receive OUT− from sense amplifier 308. Inverter 440 has its output coupled to access transistor 444. Inverter 442 has its input coupled to input INT that is configured to receive OUT+ from sense amplifier 308. Inverter 442 has its output coupled to access transistor 446. Access transistor 444 has its gate coupled to WL0, its drain (source) coupled to BL, and its source (drain) coupled to the output of inverter 440. Access transistor 446 has its gate coupled to WL0, its drain (source) coupled to BLB, and its source (drain) coupled to the output of inverter 442.

When SELEQ is high, access transistor 444 couples an inverted OUT− signal to BL, and access transistor 446 couples an inverted OUT+ signal to BLB.

Inverters 416, 418, 428, 430, 440, and 442 may be CMOS inverters, NMOS inverters, or PMOS inverters, and may include active (e.g., transistor) loads or passive (e.g., resistor) loads.

Figure 5:
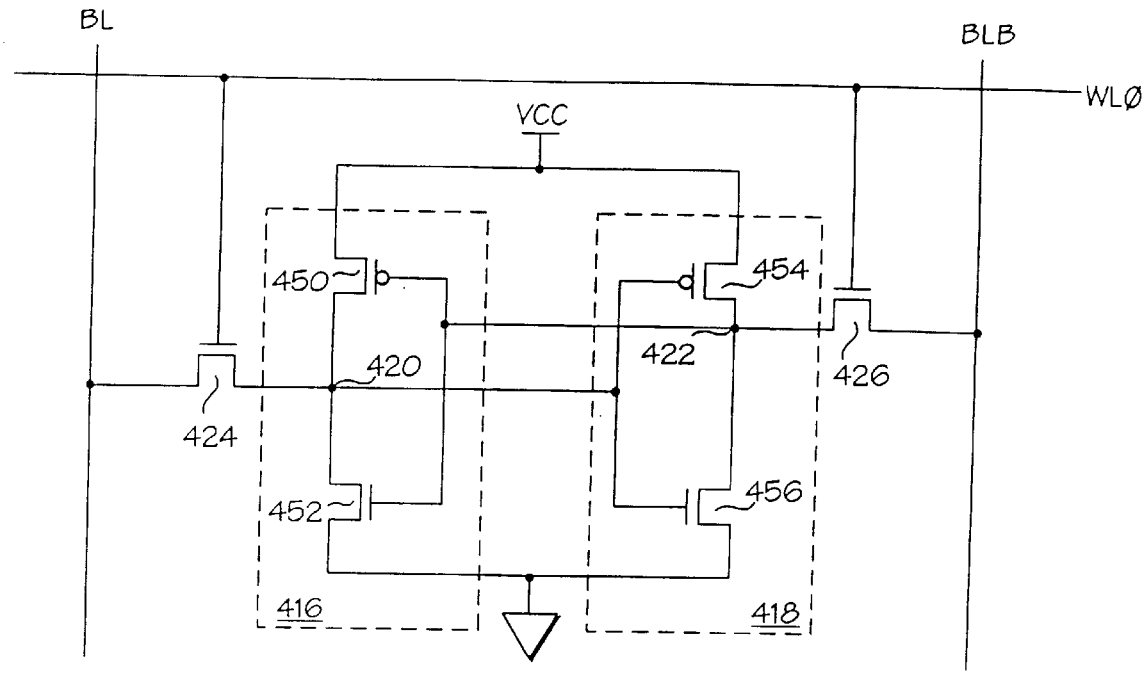
FIG. 5 is a circuit diagram of one embodiment of the memory cells of FIG. 4.

FIG. 5 shows one embodiment of memory cell 402 wherein inverters 416 and 418 are CMOS inverters. Inverter 416 includes p-channel transistor 450 having its source coupled to VCC, its drain coupled to node 420, and its gate coupled to node 422. Inverter 416 also includes n-channel transistor 452 having its drain coupled to node 420, its source coupled to ground, and its gate coupled to node 422. Inverter 418 includes p-channel transistor 454 having its source coupled to VCC, its drain coupled to node 422, and its gate coupled to node 420. Inverter 418 also includes n-channel transistor 456 having its drain coupled to node 422, its source coupled to ground, and its gate coupled to node 420. For one embodiment, the width to length ratios in microns are approximately 0.5/0.55 for p-channel transistors 450 and 454, and 0.8/0.5 for n-channel transistors 452 and 456. For other embodiments, other transistor sizes may be used.

Figure 6:
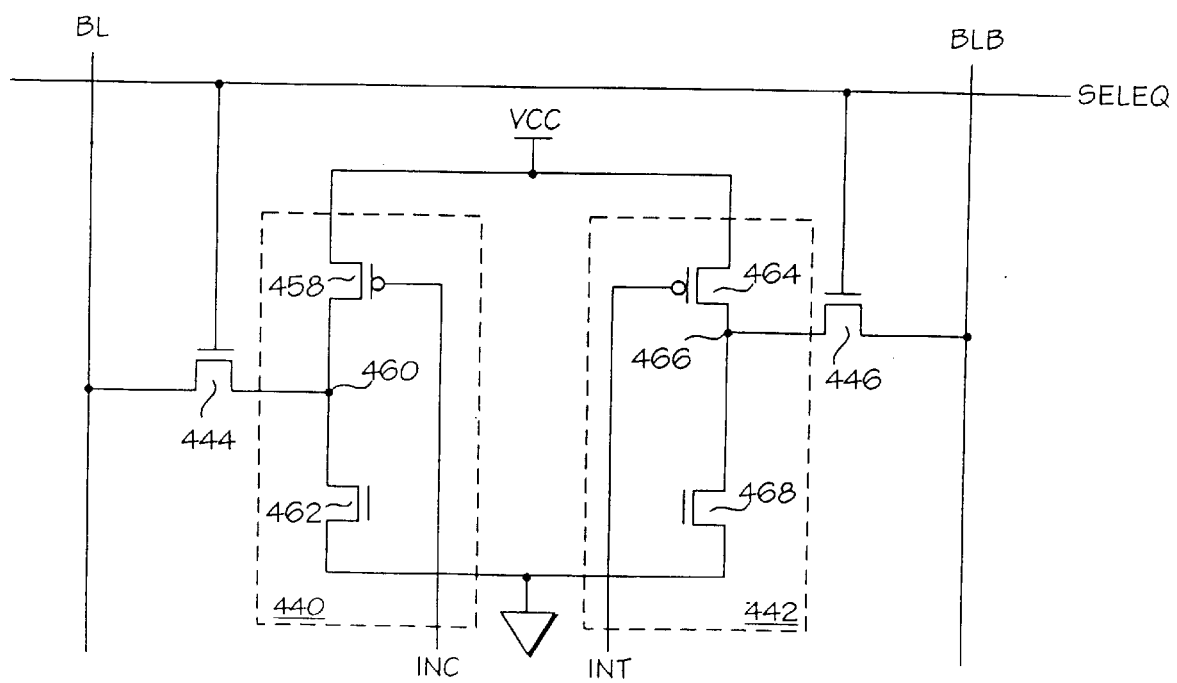
FIG. 6 is a circuit diagram of one embodiment of the equalization cell of FIG. 4.

FIG. 6 shows one embodiment of equalization cell 406 wherein inverters 440 and 442 are CMOS inverters. Inverter 440 has a p-channel transistor 458 having its source coupled to VCC, its drain coupled to node 460 and access transistor 444, and its gate coupled to INC. Inverter 440 also includes n-channel transistor 462 having its drain coupled to node 460, its source coupled to ground, and its gate coupled to INC. Inverter 442 has a p-channel transistor 464 having its source coupled to VCC, its drain coupled to node 466 and access transistor 446, and its gate coupled to INT. Inverter 442 also includes n-channel transistor 468 having its drain coupled to node 466, its source coupled to ground, and its gate coupled to INT. For one embodiment, the width to length ratios in microns are approximately 0.5/0.55 for p-channel transistors 458 and 464, and 0.8/0.5 for n-channel transistors 462 and 468. For other embodiments, other transistor sizes may be used.

Memory column 400 also includes bit line load circuit 410 including p-channel transistors 412 and 414 configured as diodes. P-channel transistor 412 has its source coupled to power supply VCC and its gate and drain coupled to BL. P-channel transistor 414 has its source coupled to VCC and its gate and drain coupled to BLB.

Figure 7:
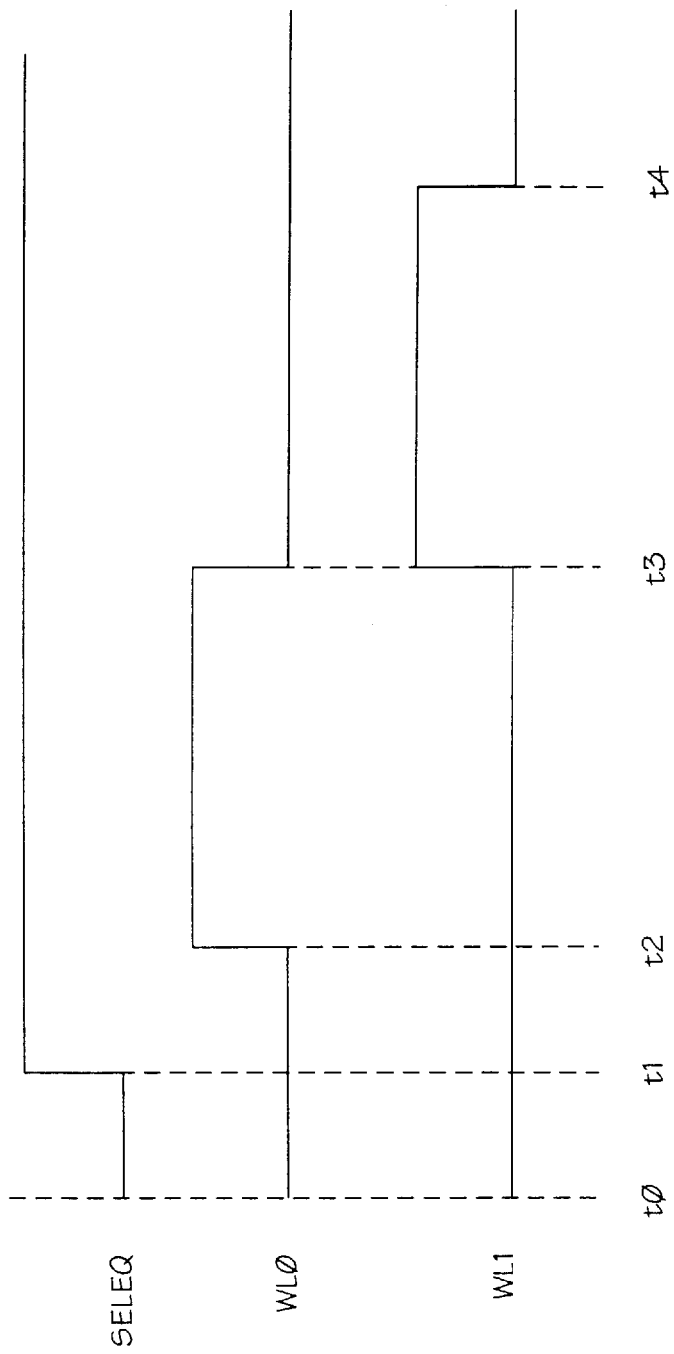
FIG. 7 is a waveform diagram of signals from FIG. 4.

The operation of FIG. 4 is described with respect to FIG. 7. At time t0, WL0, WL1, and SELEQ are all low and column 400 or the memory block containing block 400 is deselected. Also at time t0, sense amplifier 308 is disabled and OUT+ and OUT− are low. At time t1, SELEQ transitions to a high state to enable access transistors 444 and 446 such that inverters 440 and 442 may couple high voltages to bit lines BL and BLB, respectively. At time t2, WL0 transitions to a high state such that access transistors 418 and 420 are enabled and data stored at nodes 420 and 422 may be read out of memory cell 402. For one embodiment, the difference between times t1 and t2 is approximately 0 ns to 5 ns. Other times may be used.

For the purpose of illustration, assume that memory cell 402 stores a logic one state at node 420 and a logic zero state at node 422, such that when WL0 transitions to a high state, load transistor 412 and inverters 416 and 440 drive BL to a higher voltage than load transistor 414 and inverters 418 and 442 drive BLB. Between times t2 and t3, sense amplifier 308 senses the voltage difference on BL and BLB and causes OUT+ to be driven to a low logic state and OUT− to be driven to a high logic state. The low logic state on OUT+ is coupled to the input of inverter 442 of equalization cell 406. Inverter 442 inverts the low logic state to a high logic state. Given that SELEQ is high, access transistor 446 couples the high logic state to BLB at the same time that memory cell 402 continues to drive BLB to a low logic state. Thus, memory cell 402, equalization cell 406, and load transistor 414 determine the final voltage on BLB.

Similarly, the high logic state on OUT− is coupled to the input of inverter 440 of equalization cell 406. Inverter 440 inverts the high logic state to a low logic state. Given that SELEQ is high, access transistor 444 couples the low logic state to BL at the same time that memory cell 402 continues to drive BL to a high logic state. Thus, memory cell 402, equalization cell 406, and load transistor 412 determine the final voltage on BL. If p-channel transistors 412 and 414 have approximately the same geometry, and if inverters 416, 418, 440, and 442 are sized to have approximately the same drive capability, then BL and BLB will settle to voltages that have approximately the same voltage, that is, they will equalize due to the negative feedback arrangement of sense amplifier 308 with equalization cell 406.

At time t3, WL0 transitions to a low state deselecting memory cell 402. Also at time t3, WL1 transitions to a high state selecting memory cell 404 and enabling the data stored at nodes 432 and 434 to be output to bit lines BL and BLB, respectively. If the data is the same as that read from memory cell 402, that is, node 432 storing a high logic state and node 434 storing a low logic state, then the bit lines will remain equalized and sense amplifier 308 will continue to output the correct outputs on lines OUT+ and OUT−. Therefore, the access time of reading data in memory cell 404 will be extremely fast and may be on the order of approximately 0–3 ns.

The outputs of sense amplifier 308 will need to change if the data stored at nodes 432 and 434 is not the same as that read from memory cell 402, for example, if nodes 432 and 434 output a low logic state on BL and a high logic state on BLB, respectively. Before sense amplifier 308 flips in response to the new state read from memory cell 404, the feedback arrangement between sense amplifier 308 and equalization 406 changes from a negative feedback arrangement to a positive feedback arrangement such that sense amplifier 308 will quickly detect the new state on BL and BLB. For example, when WL1 transitions to a high state, and before the outputs of sense amplifier 308 transition states, both memory cell 404 and equalization cell 406 will be driving BL to a low logic state and BLB to a high logic state. This will approximately double the slew rate (dV/dt) of the data driven on BL and BLB because two cells (memory cell 404 and equalization cell 406) are driving in parallel BL and BLB to the same state rather than memory cell 404 by itself. When the voltage on BLB becomes greater than the voltage on BL, then sense amplifier 308 causes OUT+ to transition to a high logic state and OUT− to transition to a low logic state. When OUT+ is high, inverter 442 outputs a low logic state that is coupled to BLB by access transistor 446. The low logic state output by equalization cell 406, the high logic state output by selected memory cell 404, and load transistor 414 bring BLB to a final voltage. Similarly, when OUT− is low, inverter 440 outputs a high logic state that is coupled to BL by access transistor 444. The high logic state output by equalization cell 406, the low logic state output by selected memory cell 404, and load transistor 412 bring BL to a final voltage that is approximately equal to the final voltage on BLB. Thus, BL and BLB are driven to equalized voltages.

At time t4, WL1 transitions to a low state to enable other memory cells in column 400 to be selected. To write to a selected memory cell, SELEQ may be asserted to a low state to disable equalization cell 406.

If sense amplifier 308 happens to transition to a wrong state relative to a selected memory cell, then the negative feedback arrangement between sense amplifier 308 and equalization cell 406 may also change to a positive feedback arrangement and quickly cause sense amplifier 308 to correct itself. For example, if memory cell 402 is selected and outputting a high logic state on BL and a low logic state on BLB, but due to noise or some other phenomenon, sense amplifier 308 is outputting OUT+ as a high logic state and OUT− as a low logic state, then both equalization cell 406 and memory cell 402 will drive BL high and BLB low and cause sense amplifier to quickly transition OUT+ to a low logic state and OUT− to a high logic state. Thus, the present invention can quickly recover when sense amplifier 308 outputs a wrong state. Because of the increased slew rate caused by multiple cells driving BL and BLB to the correct states at one time, there may be little (e.g., approximately 1–10%) or no push-out of the access time for reading a given memory cell.

The final equalized voltages on BL and BLB may be designed to be greater than the DC trip point of inverters 416, 418, 428, and 430 plus the static noise margin of these inverters. This may increase stability within memory cells 402 and 404 by providing sufficient margin on the equalization voltages such that data stored in memory cells 402 and 404 does not flip to an erroneous state.

For one embodiment, the DC trip point of inverters 416, 418, 428, and 430 is designed to be less than the difference between (VCC−ground)/2 and the static noise margin of memory cells 402 and 404. For this embodiment, equalized voltages on BL and BLB may be designed to be approximately (VCC−ground)/2.

Figure 8:
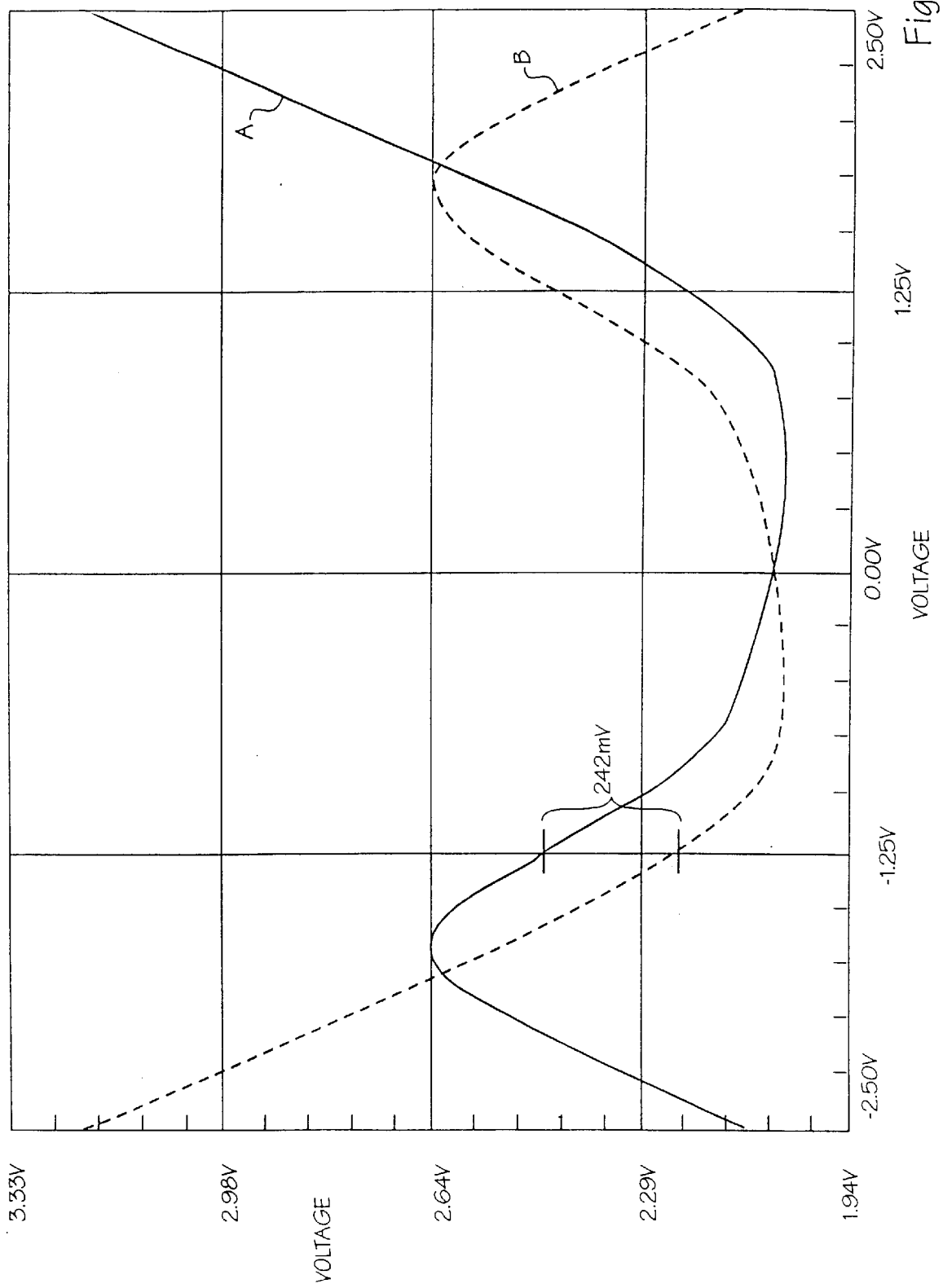
FIG. 8 is a butterfly diagram of one embodiment of a memory cell.

The static noise margin of a memory cell may be readily determined through characterization or simulation of the memory cell and generation of a butterfly diagram as generally known in the art. FIG. 8 shows one embodiment of a butterfly diagram for memory cell 402 having CMOS inverters as illustrated in FIG. 5, where the width to length ratios in microns are approximately 0.5/0.55 for p-channel transistors 450 and 454, and 0.8/0.5 for n-channel transistors 452 and 456. The butterfly diagram plots the change in voltage at nodes 420 and 422 (vertical axis) vs. the change in voltage at bit lines BL and BLB (horizontal axis). Waveform A corresponds to node 420, and waveform B corresponds to node 422. The maximum static noise margin for this embodiment is approximately 242 millivolts as determined at the −1.25 volt vertical line. The butterfly diagram was simulated at a temperature of approximately −10° C., and at a VCC power supply voltage of approximately 3.7 volts. Therefore, for one embodiment, the equalization voltage may be designed to be greater than the DC trip point of inverters 418 and 420 plus 242 millivolts.

Figure 9:
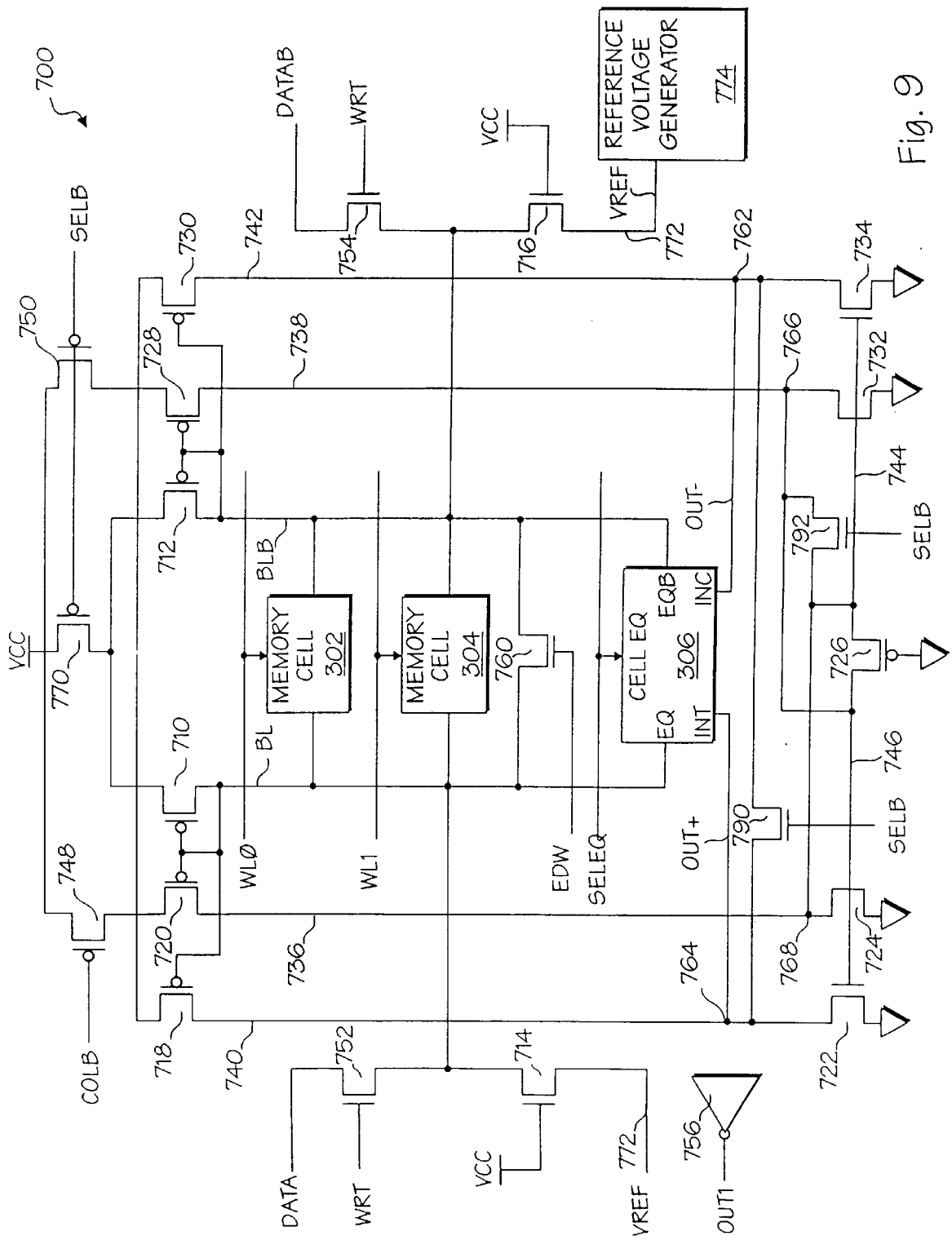
FIG. 9 is a circuit diagram of a more detailed embodiment of FIG. 3.

FIG. 9 shows memory device 700 including one embodiment of sense amplifier 308 and other supporting circuitry including reference voltage generator 774.

Memory device 700 includes bit line load circuitry having p-channel diode connected transistors 710 and 712. Transistor 710 has its gate and drain coupled to BL and its source coupled to the drain of column select transistor 770. Transistor 712 has its gate and drain coupled to BLB and its source coupled to the drain of column select transistor 770. Column select transistor 770 has its gate coupled to select signal SELB and it source coupled to VCC. When the column containing memory cells 302 and 304 is selected, SELB may be low such that transistor 770 couples VCC to the sources of p-channel transistors 710 and 712. When the column containing memory cells 302 and 304 is deselected, SELB may be high such that transistor 770 does not couple VCC to the sources of p-channel transistors 710 and 712. For one embodiment, the width to length ratio in microns of transistor 770 is approximately 10/0.5. Other sizes may be used.

P-channel load transistors 710 and 712 operate in conjunction with memory cells 302 and 304 and equalization cell 306 to generate equalization voltages on bit line BL and BLB as generally described with respect to p-channel load transistors 412 and 414 of FIG. 4. For one embodiment, p-channel transistors 710 and 712 have width to length ratios in microns of approximately 4/0.55. Other sizes may be used.

Memory device 700 illustrates one embodiment of sense amplifier 308 that is a current sense amplifier. Sense amplifier 308 includes p-channel transistors 720 and 728, n-channel transistors 724 and 732, and p-channel transistor 726. P-channel transistor 720 is connected in a current mirror configuration with p-channel load transistor 710 such that the gate of p-channel transistor 720 is coupled to the gate of p-channel transistor 710 and BL. The source of p-channel transistor 720 is coupled to the drain of column select transistor 748, and the drain of transistor 720 is coupled to the drain of n-channel transistor 724. P-channel transistor 728 is connected in a current mirror configuration with p-channel load transistor 712 such that the gate of p-channel transistor 728 is coupled to the gate of p-channel transistor 712 and BLB. The source of p-channel transistor 728 is coupled to the drain of column select transistor 750, and the drain of transistor 728 is coupled to the drain of n-channel transistor 732. For one embodiment, the width to length ratios in microns of p-channel transistors 720 and 728 are 4/0.5. Other sizes may be used.

The sources of n-channel transistors 724 and 732 are coupled to ground. The gate of transistor 724 is coupled to the drain (source) of p-channel transistor 726 at line 746, and to the drain of transistor 732 at node 766. The gate of transistor 732 is coupled to the source (drain) of p-channel transistor 726 at line 744, and to the drain of transistor 724 at node 768. The gate of transistor 726 is coupled to ground. For one embodiment, the width to length ratios in microns of n-channel transistors 724 and 732 are 1.1/0.6. Other sizes may be used.

When the data stored in memory cells 302 or 304 is read onto bit lines BL and BLB, p-channel transistor 726 prevents the voltage imbalance on nodes 766 and 768 from spreading past a predetermined amount. For example, p-channel transistor 726 may prevent the voltage imbalance from becoming greater than approximately 300–700 millivolts. The amount of imbalance may be controlled by controlling the drive strength of transistor 726. Adjusting the drive strength of P-channel transistor 726 also may perform the function of controlling the amount of hysteresis in the sense amplifier circuitry. Generally, the greater the drive strength (i.e., the higher the transconductance) of transistor 726, the smaller the amount of hysteresis with respect to the voltages on BL and BLB. For one embodiment, the width to length ratio of transistor 726 in microns is approximately 1.1/0.55. Other sizes may be used.

Memory device 700 also includes two circuits that convert the analog voltages on nodes 768 and 766 to CMOS logic levels at nodes 764 and 762, respectively. The first circuit includes p-channel transistor 718 and n-channel transistor 722. P-channel transistor 718 is coupled in a current mirror configuration with p-channel transistor 710. P-channel transistor has its source coupled to the drain of column select transistor 748, its drain coupled to the drain of n-channel transistor 722 at node 764, and its gate coupled to BL. N-channel transistor 722 has its source coupled to ground and its gate coupled to line 746 and the drain of transistor 732 at node 766. The second circuit includes p-channel transistor 730 and n-channel transistor 734. P-channel transistor 730 is coupled in a current mirror configuration with p-channel transistor 712. P-channel transistor 730 has its source coupled to the drain of column select transistor 750, its drain coupled to the drain of n-channel transistor 734 at node 762, and its gate coupled to BLB. N-channel transistor 734 has its source coupled to ground and its gate coupled to line 744 and the drain of transistor 724 at node 768. Sense amplifier outputs OUT+ and OUT− are at nodes 764 and 762, respectively.

One output of the sense amplifier circuitry at node 764 may be coupled to the input of inverter 756. The output, OUT1, of inverter 756 may be coupled to output buffer 214 or other circuitry. The other output of the sense amplifier circuitry at node 762 may be coupled to the input of another inverter (not shown) that may output another signal to output buffer 214 or other circuitry.

Memory device 700 further includes column select p-channel transistors 748 and 750 that control the selection of the column containing memory cells 702 and 704 by controlling whether power is supplied to p-channel transistors 718, 720, 728, and 730. P-channel transistor 748 has its gate coupled to COLB, its source coupled to VCC, and its drain coupled to the sources of p-channel transistors 718 and 720. When COLB is low, VCC is coupled to the sources of p-channel transistors 718 and 720 and one input to the sense amplifier circuitry is enabled. When COLB is high, VCC is not coupled to the sources of p-channel transistors 718 and 720 effectively disabling one input of the sense circuitry. Similarly, p-channel transistor 750 has its gate coupled to SELB, its source coupled to VCC, and its drain coupled to the sources of p-channel transistors 728 and 730. When SELB is low, VCC is coupled to the sources of p-channel transistors 718 and 720 and one input to the sense amplifier circuitry is enabled. When SELB is high, VCC is not coupled to the sources of p-channel transistors 718 and 720 effectively disabling one input of the sense circuitry. COLB and SELB may be generated by column decoder 212 or by read/write control 208.

Memory device 700 may also include circuitry for equalizing internal nodes within the sense amplifier circuitry. For example, n-channel transistors 790 and 792 may be included within the sense amplifier circuitry. Transistor 790 has its drain (source) coupled to line 740, its source (drain) coupled to line 742, and its gate coupled to SELB. Transistor 792 has its source (drain) coupled to line 736, its drain (source) coupled to line 738, and its gate coupled to SELB. When the column or block containing the sense circuitry is deselected, SELB is high and transistor 790 shorts line 740 to line 742, and transistor 792 shorts line 736 to line 738. When SELB is low, transistors 790 and 792 are off. For one embodiment, the width to length ratio in microns for transistors 790 and 792 is approximately 1.1/0.5. Other sizes may be used.

Memory device 700 may also include write circuitry such as transistors 752 and 754. Transistor 752 has a drain (source) coupled to DATA, a source (drain) coupled to BL, and a gate coupled to write control signal WRT. The write control signal WRT may be generated by read/write control 208. Similarly, transistor 754 has a drain (source) coupled to DATAB, a source (drain) coupled to BLB, and a gate coupled to WRT. When WRT is at a high logic level, transistors 752 and 754 couple DATA and DATAB to BL and BLB, respectively. When WRT is at a low logic level, transistors 752 and 754 are off and do not couple DATA and DATAB to BL and BLB, respectively. DATAB may include data that has an opposite logic state relative to DATA. For one embodiment, the width to length ratio in microns transistors 752 and 754 may be approximately 5/0.5. Other sizes may be used.

The write circuitry may further include pass transistor 760 that has its drain (source) coupled to BL, its source (drain) coupled to BLB, and its gate coupled to end-of-write signal EOW. When DATA and DATAB are written to BL and BLB, respectively, the voltages on BL and BLB will excurt to different voltage levels. Pass transistor may be included to quickly equalize BL and BLB prior to a subsequent read after write operation. When EOW is high pass transistor 760 couples BL to BLB such that BL and BLB will settle at approximately the same equalized voltages. EOW may be generated by read/write control 208 at the end of a write cycle (e.g., when WEB transitions to a low state). For one embodiment, the width to length ratio in microns transistor 760 may be approximately 5/0.5. Other sizes may be used.

When the column containing memory cell 302 and 304 is deselected or a block of memory containing the column is deselected, then in order to maintain BL and BLB at approximately the same equalization voltages relative to selected memory blocks, reference voltage generator 774 may be included to generate equalization voltage VREF to be coupled to BL and BLB by transistors 714 and 716, respectively. Pass transistors 714 and 716 each have their gates coupled to a high logic state such as VCC, their drains (sources) coupled to VREF at line 772 and their sources (drains) coupled to BL and BLB, respectively. Transistors 714 and 716 may be weak pass transistors that do not generally interfere with the operation of bit lines BL and BLB of a selected memory block but allow VREF to be coupled to bit lines of deselected memory blocks. For one embodiment, the width to length ratio in microns of transistors 714 and 716 is approximately 1.1/5.

For one embodiment, only one reference voltage generator is required per memory device. This one reference voltage generator may be coupled to each bit line pair in every column of every memory block. For other embodiments, more than one reference voltage generator may be included in a memory device and coupled to one or more pairs of bit lines.

Figure 10:
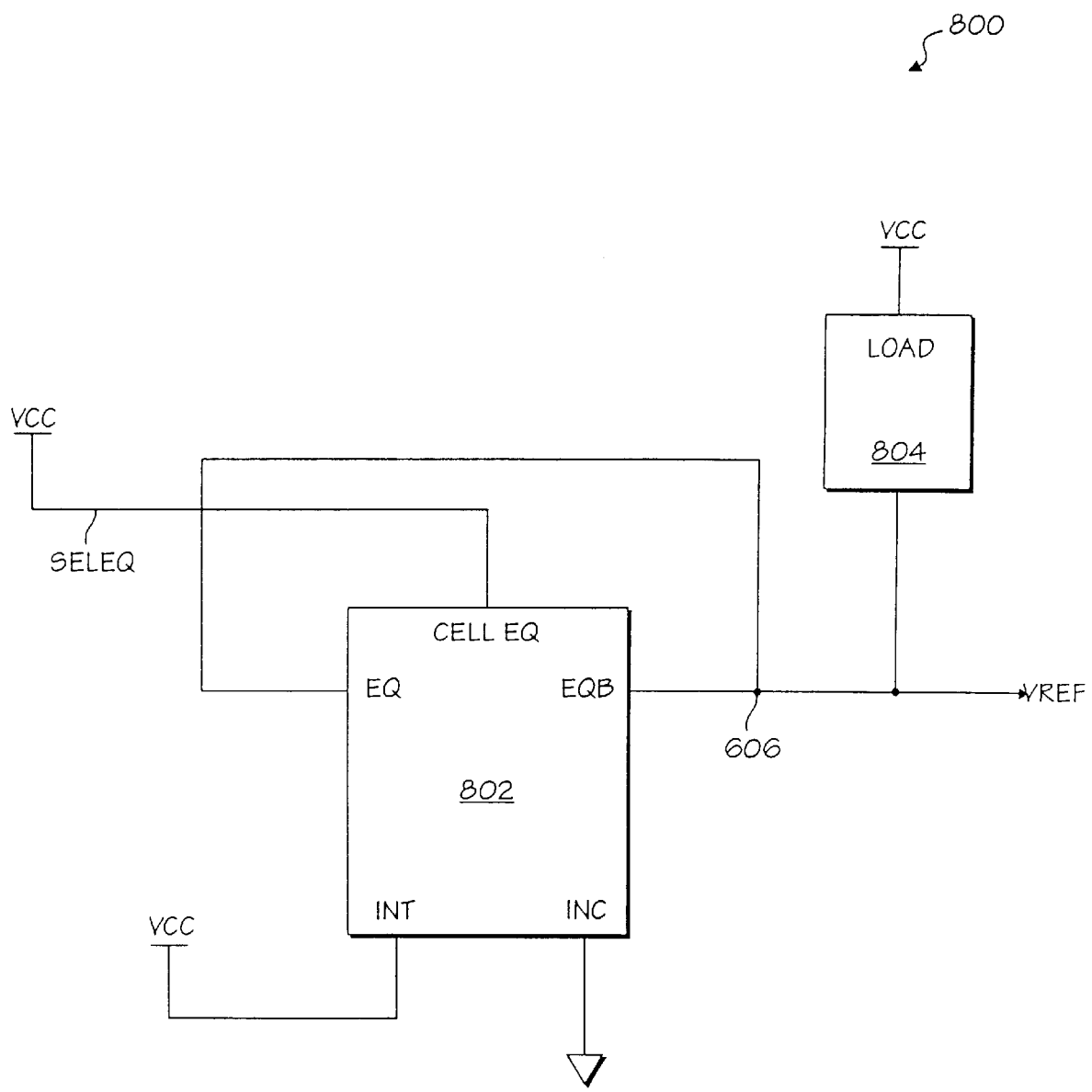
FIG. 10 is a circuit diagram of one embodiment of a reference voltage generator.

FIG. 10 shows reference voltage generator 800 that is one embodiment of a reference voltage generator 744. Reference voltage generator 800 includes an equalization cell 802 that may be identical to equalization cell 306 or 406 of FIGS. 3 and 4, respectively. Equalization cell 802 has its EQ output coupled to its EQB output at line 806, its INT input coupled to a high logic state such as VCC, and its INC input coupled to a low logic state such as ground. For another embodiment, INT may be coupled to a low logic state, and INC may be coupled to a high logic state.

Reference voltage generator 800 also includes load circuit 804 coupled between power supply VCC and line 806. Together, load circuit 804 and equalization cell 802 drive line 806 to reference voltage VREF that is approximately the same voltage as the equalization voltage to which memory cells 302 and 302, equalization cell 306, and bit line load transistors 710 and 712 would drive BL and BLB.

For one embodiment, load circuit 804 is a p-channel diode connected transistor. The p-channel diode connected ransistor may be included within reference voltage generator 800 to provide the same function as bit line load transistors 710 and 712. For example, when a column containing memory cells 302 and 304 is deselected by asserted SELB to a low state, transistor 770 is off and bit lines BL and BLB. Thus, to replicate the equalization voltage on BL and BLB, a p-channel diode connected transistor, having approximately the same geometry as transistors 710 and 712, may be included within reference voltage generator 800.

For one embodiment, equalization cell 802 may have two inverter circuits and two access transistors as illustrated in equalization cell 406 of FIG. 4. The access transistors may be always on when SELEQ is coupled to VCC. For this embodiment, the high logic state at INT will be inverted by an inverter causing EQB to output a low logic state to line 806. Also, the high logic state at INC will be inverted by an inverter causing EQ to output a high logic state to line 806. Thus, EQ will drive line 806 to a one logic state, while EQB will drive line 806 to an opposite logic state while load circuit 804 pulls up line 806 towards VCC. This is the same mechanism that drives BL and BLB to equalization voltages as illustrated by columns 300 and 400 of FIGS. 3 and 4, respectively. If load circuit 804 is designed to have approximately the same drive as transistors 710 and 712, and if equalization cell 802 is designed to have approximately the same drive (i.e., transistor elements having approximately the same size ratios) as memory cells 302 and 304, then VREF will have approximately the same equalization voltage as that driven to BL and BLB by memory cells 302 and 304 and equalization cell 306 of FIG. 3.

Figure 11:
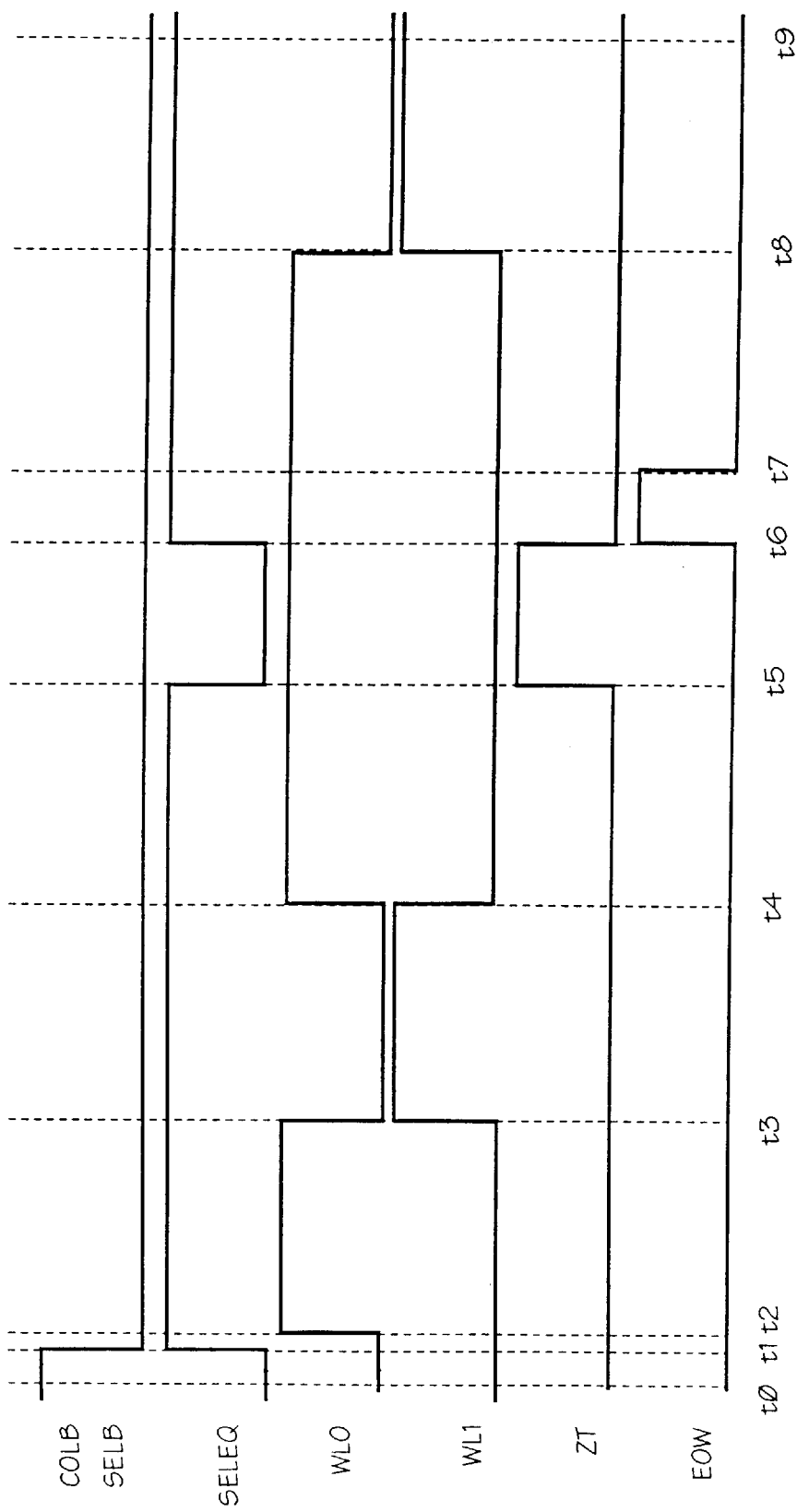
FIG. 11 is a waveform diagram of signals from FIG. 9.

The operation of memory device 700 may be illustrated with respect to the exemplary waveform diagram of FIG. 11. At time t0, COLB and SELB are high, indicating that the column or block of memory in which memory cells 302 and 304 are located is deselected. Also at time t0, SELEQ is low such that equalization cell 306 is disabled from outputting voltages from EQ and EQB to BL and BLB, respectively. From time t0 to t1, VREF is coupled to BL and BLB such that these bit lines are maintained at approximately the same equalization voltage. For one embodiment, VREF may be approximately 1.2–1.5 volts when memory device is operating at approximately 100° C. and VCC is approximately 2.9 volts.

At time t1, COLB and SELB transition to a low state causing p-channel transistors 748, 750, and 770 to be turned on and couple VCC to the sources of p-channel transistors 710, 712, 718, 720, 728, and 730. Also at time t1, SELEQ transitions to a high state causing equalization cell 306 to be enabled to output high voltages to BL and BLB from outputs EQ and EQB, respectively.

Between times t2 and t3, memory cell 302 is selected for reading. At time t2, word line WL0 transitions to a high state to enable the data stored in memory cell 302 to be output to BL and BLB. For one embodiment, the time difference between times t1 and t2 may be approximately 0–5 ns. The current on BL and BLB is sensed by the sense circuitry, such that the appropriate voltages on OUT+ and OUT– are coupled to INT and INC of equalization cell 306. Equalization cell 306 then outputs voltages from EQ an EQB to BL and BLB, to oppose the data output by memory cell 302 such that BL and BLB are equalized.

For example, if memory cell 702 outputs a logic zero on BL and a logic one on BLB, a greater amount of current will flow on BL than on BLB. The current flowing on BLB will be mirrored onto lines 738 and 742 by the current mirror configuration of p-channel transistors 712, 728, and 730. The current flowing through BL will be mirrored onto lines 736 and 740 by the current mirror configuration of p-channel transistors 710, 718, and 720. As the current flowing through BL and line 736 increases, the voltage at node 768 will increase until it causes transistor 732 to turn on. Similarly, as the current flowing through BLB and line 738 decreases, the voltage at node 766 will decreases until it causes transistor 724 to turn off. When transistor 724 turns off and transistor 732 turns on, the voltage at node 768 will be higher than the voltage at node 766 with their respective voltages limited by transistor 726. For one embodiment, the difference between the voltages at nodes 768 and 766 is limited by transistor 726 to approximately 300–700 millivolts.

Given that line 740 is not coupled to the gate of transistor 732 as is transistor 724, OUT+ at node 764 may rise to a voltage level that is not limited by transistor 726. Similarly, given that line 742 is not coupled to the gate of transistor 724, OUT– at node 762 may decrease to a voltage level that is not limited by transistor 726. For one embodiment, equalization cell 306 includes CMOS inverters as in FIG. 6, and the voltage at node 764 may rise to a CMOS one logic level such and the voltage at node 762 may decrease to a CMOS zero logic level. The logic one level on INC will cause equalization cell 306 to output a low logic level to BL from output EQ. The logic zero level on INT will cause equalization cell 406 to output a high logic level to BLB from output EQB. Thus, bit lines BL and BLB will then be driven to equalization voltages by equalization cell 306, memory cell 302, and bit line load transistors 710 and 712.

At time t3, WL0 transitions to a low state to deselect memory cell 302, and WL1 transitions to a high state to enable the contents of memory cell 304 to be read onto BL and BLB. At time t4, WL1 transitions to a low state to deselect memory cell 304, and WL0 transitions to a high state to enable the contents of memory cell 302 to be read onto BL and BLB.

At time t5, SELEQ transitions to a low state and WRT transitions to a high state such that DATA may be written to BL and memory cell 302, and such that DATAB may be written to BLB and memory cell 302. At time t6, the WRT pulse ends and SELEQ transition high to enable equalization cell 706. From time t6 to time t7, a short EOW pulse may be coupled to pass transistor 760 to help equalize BL and BLB. For one embodiment, the time difference between times t6 and t7 may be from approximately 2–7 ns.

When the EOW pulse ends at time t7, WL0 is still in a high state such that the data written into memory cell 302 may then be immediately read from memory cell 302 during times t7 through t8. At time t9, WL0 transitions to a low state to deselect memory cell 302, and WL1 transitions to high state to select WL1 such that the contents of memory cell 704 may be output to BL and BLB.

Figure 12:
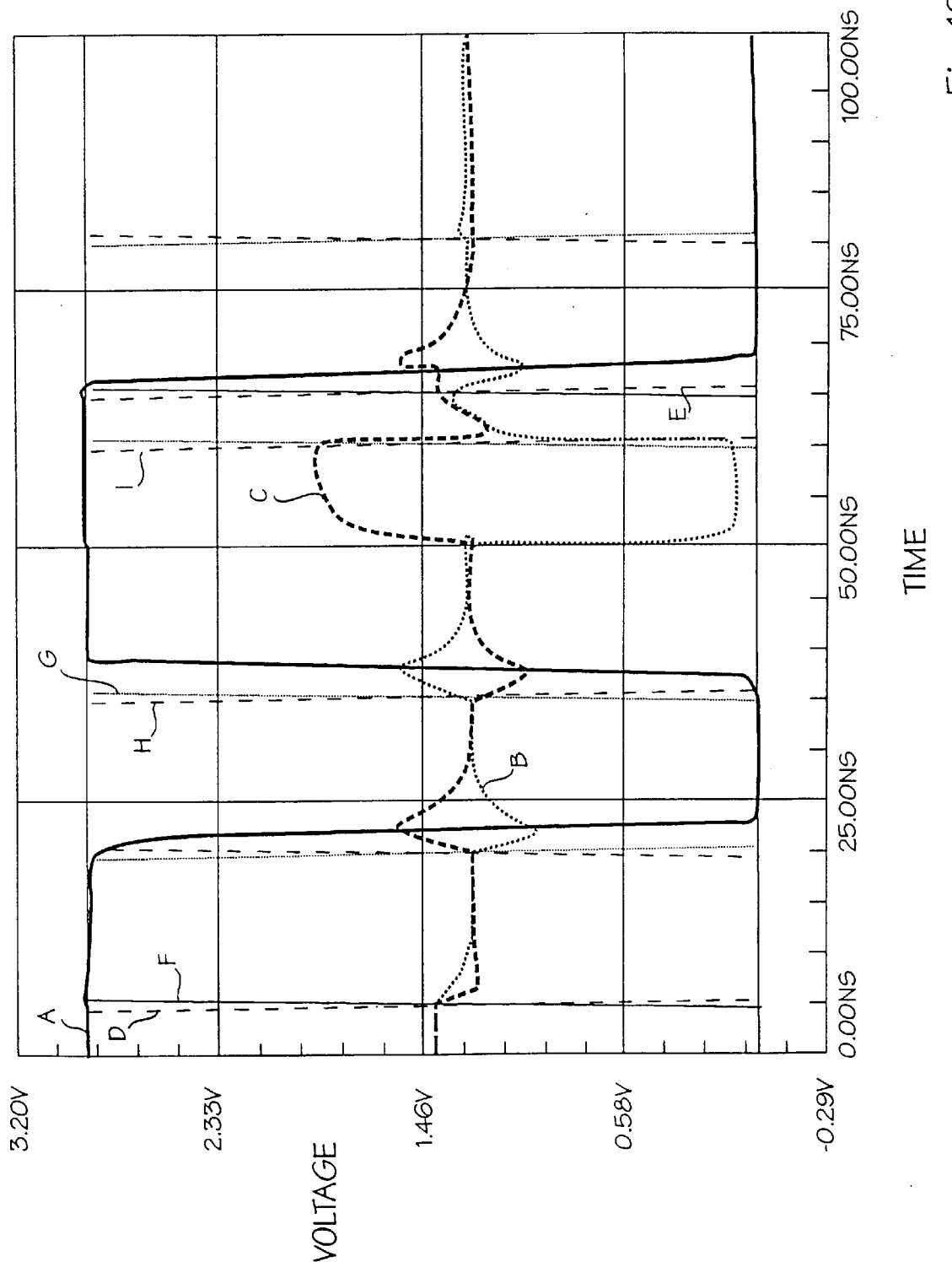
FIG. 12 is simulated signals corresponding to the waveform diagram of FIG. 11.
Figure 13:
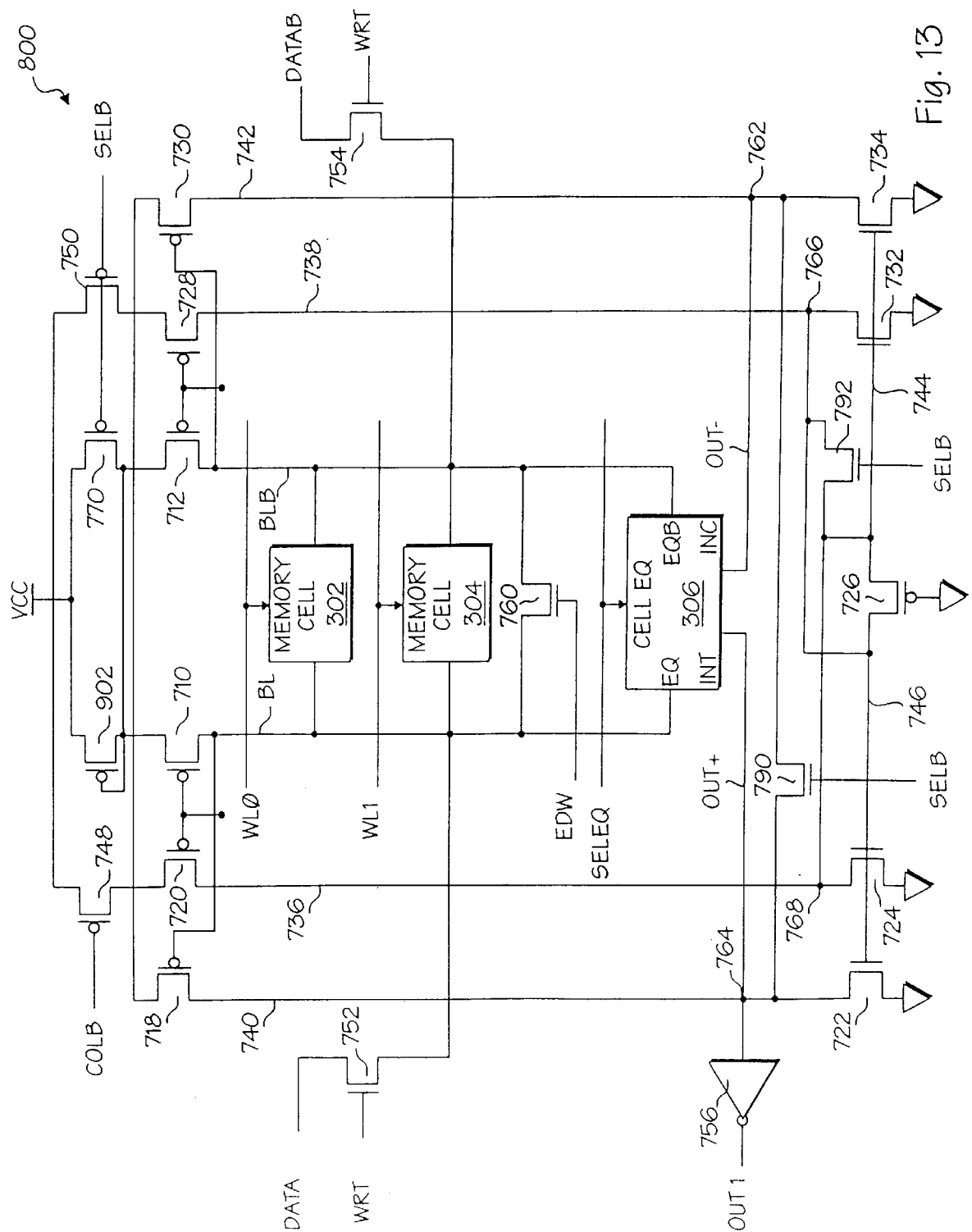
FIG. 13 is a circuit diagram of another more detailed embodiment of FIG. 3.

FIG. 12 shows actual simulated waveforms of memory device 700 corresponding to the exemplary waveforms shown in FIG. 11. Waveform A corresponds to OUT1, waveform B corresponds to BL, waveform C corresponds to BLB, waveform D corresponds to SELB and COLB, waveform E corresponds to EOW, waveform F corresponds to SELEQ, waveform G corresponds to WL0, waveform H corresponds to WL1, and waveform I corresponds to WRT. Times t0, t1, t2, t3, t4, t5, t6, t7, and t9 of FIG. 11 correspond approximately to times 0 ns, 4 ns, 5 ns, 20 ns, 35 ns, 50 ns, 60 ns, 65 ns, 80 ns, and 95 ns in FIG. 12. The signals shown in FIG. 12 were simulated at approximately 100° C. and VCC approximately equal to 2.9 volts.

Compared with a previous fast ATD based SRAM device, memory device 700 may have a sense path that is approximately 30–35% faster, may consume approximately the same amount of current, and may use approximately 20–25% less gate area for supporting circuitry including the sense amplifier circuitry and the other circuitry shown in FIG. 9, but excluding memory cells 302 and 304. The previous fast ATD based SRAM device includes a much larger sense amplifier circuit that is shared between eight columns of memory cells. Table 1 summarizes measured results. The speed of the sense path is measured from the transition of a word line (e.g., WL0) until OUT1 transitions to VCC/2 as shown in FIG. 12.

TABLE 1

| Parameter | Fast ATD SRAM | Memory device 700 |
| --- | --- | --- |
| Speed | 3.75 ns | 2.84 ns |
| Current per column | 0.578 mA | 0.590 mA |
| Total gate area | 52.58 sq. $\mu$m | 40.69 $\mu$m |

FIG. 12 illustrates memory device 900 that is alternative embodiment of memory device 700 of FIG. 9. Memory device 900 does not include reference voltage generator 744 or pass transistors 714 and 716 to drive equalization voltage VREF to BL and BLB when the column containing memory cells 302 and 304 are deselected. In contrast, memory device 900 includes p-channel transistor 902 that is coupled in parallel with transistor 770. P-channel transistor 902 is configured in a diode-configuration having its gate and drain coupled to the sources of p-channel transistors 710 and 712, and its source coupled to VCC.

When SELB is high, memory cells 302 and 304 are deselected and p-channel transistor 770 is off. P-channel transistor 902 remains on such that BL will settle at an equalization voltage of approximately two p-channel threshold drops below VCC due to transistors 902 and 710. Similarly, BLB will settle at an equalization voltage of approximately two p-channel threshold drops below VCC due to transistors 902 and 712.

When SELB is low, memory cells 302 and 305 may be selected and p-channel transistor 770 is on. When p-channel transistor 770 is on, it effectively shorts out transistor 902 such that transistor 902 does not help determine the equalization voltages on BL and BLB. For one embodiment, the width to length ratio in microns for p-channel transistor 902 is approximately 2/0.5, and for p-channel transistor 770 is approximately 10/0.5. Other sizes may be used.

For other embodiments, more than one diode-connected transistor may be coupled in series with transistors 902 and in parallel with transistor 770 in order to generate desired equalization voltages on BL and BLB.

Although the present invention has been described in terms of specific exemplary embodiments, it will be appreciated that various modifications and alternations might be made by those skilled in the art without departing from the spirit and scope of the invention as set forth in the following claims.

What is claimed is:

1. A memory device comprising:
   a first bit line;
   a second bit line;
   a bit line load circuit coupled to the first and second bit lines;
   a memory cell couples to the first and second bit lines;
   a first equalization circuit having an input, a first output coupled to the first bit line, and a second output coupled to the second bit line; and
   a sense amplifier circuit having a first input coupled to the first bit line, a second input coupled to the second bit line, and an output coupled to the first input of the first equalization circuit.

2. The memory device of claim 1, wherein the first equalization circuit further includes a second input and the sense amplifier circuit further includes a second output coupled to the second input of the first equalization circuit.

3. The memory device of claim 1, further comprising:
   a word line coupled to the memory cell; and
   a select line coupled to the equalization circuit.

4. The memory device of claim 3, wherein the memory cell comprises:
   a first inverter having an input and an output;
   a second inverter having an input and an output, wherein the input of the second inverter is coupled to the output of the first inverter, and wherein the output of the second inverter is coupled to the input of the first inverter;
   a first access transistor having a first terminal coupled to the first bit line, a second terminal coupled to the word line, and a third terminal coupled to the input of the second inverter and the output of the first inverter; and
   a second access transistor having a first terminal coupled to the first bit line, a second terminal coupled to the word line, and a third terminal coupled to the input of the first inverter and the output of the second inverter.

5. The memory device of claim 3, wherein the first equalization circuit comprises:
   a first inverter having an input and an output, wherein the input is configured to receive a first input signal from the first output of the sense amplifier circuit;
   a second inverter having an input and an output, wherein the input of the second inverter is configured to receive a second input signal that corresponds to the logical complement of the first input signal;
   a first access transistor having a first terminal coupled to the first bit line, a second terminal coupled to the select line, and a third terminal coupled to the output of the first inverter; and
   a second access transistor having a first terminal coupled to the second bit line, a second terminal coupled to the select line, and a third terminal coupled to the output of the second inverter.

6. The memory device of claim 1, further comprising a reference voltage generator that supplies a reference voltage to the first and second bit lines when the memory cell is deselected.

7. The memory device of claim 6, wherein the reference voltage generator comprises:
   a second equalization circuit having a first input coupled to a first logic state a second input coupled to a second logic state, a first output, and a second output, wherein the first output is coupled to the second output, and
   a load circuit coupled between the second output of the second equalization circuit and a power source, wherein the local circuit and the second equalization circuit generate the reference voltage at the second output of the second equalization circuit.

8. The memory device of claim 1, wherein the bit line load circuit comprises a diode.

9. The memory device of claim 1, wherein the sense amplifier circuit has hysteresis.

10. A memory device comprising
    a first bit line;
    a second bit line;
    means, coupled to the first and second bit lines, for pulling the first and second bit lines towards a power supply voltage;
    means, coupled to the first and second bit lines, for storing data;
    means, coupled to the first and second bit lines, for sensing the data stored in the storing means; and
    means, coupled to the sensing means and the first and second bit lines, for generating voltages that equalize voltages on the first and second bit lines.

11. The memory device of claim 1, wherein the memory cell outputs first data to the first and second bit lines, and the sense amplifier circuit senses the first data and causes the equalization circuit to output second data to the first and second bit lines, wherein the second data is the logical inverse of the first data.

12. A memory device comprising:
    a first bit line;
    a second bit line;
    a bit line load circuit coupled to the first and second bit lines;
    a memory cell coupled to the first and second bit lines wherein the memory cell outputs first data to the first and second bit lines;
    an equalization circuit coupled to the first and second bit lines; and
    a sense amplifier circuit coupled to the first and second bit lines and coupled in a negative feedback arrangement with the equalization circuit such that the sense amplifier causes the equalization circuit to output second data onto first and second bit lines, wherein the second data is the logical inverse of the first data.

13. A method of equalizing voltages of first and second bitlines in a memory device, the method comprising the steps of:
    outputting first data stored in the memory cell to the first and second bitlines;
    sensing the first data on the bit lines; and
    outputting, in response to the sensing step, second data onto the first and second bit lines, wherein the second data is the logical inverse of the first data.

14. The method of claim 13, wherein the step of outputting the first data comprises the step of outputting a first signal to the first bit line and a second signal to the second bit line, wherein the second signal is the logical inverse of the first signal, and the step of outputting the second data comprises the step of outputting a third signal to the first bit line and a fourth signal to the second bit line, wherein the third signal is the logical inverse of the first signal and the fourth signal is the logical inverse of the second signal.

* * * * *